US012750020B2

(12) United States Patent
Jia et al.

(10) Patent No.: US 12,750,020 B2
(45) Date of Patent: Sep. 29, 2026

(54) POWER AMPLIFIER SYSTEMS WITH SWITCHABLE TRANSISTOR ARRAY AND SWITCHABLE BIASING CIRCUIT

(71) Applicant: Skyworks Solutions, Inc., Irvine, CA (US)

(72) Inventors: Fei Jia, Calabasas, CA (US); Anise Muhammed Azizad, Porter Ranch, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 551 days.

(21) Appl. No.: 18/349,044

(22) Filed: Jul. 7, 2023

(65) Prior Publication Data

US 2024/0014788 A1 Jan. 11, 2024

Related U.S. Application Data

(60) Provisional application No. 63/367,972, filed on Jul. 8, 2022.

(51) Int. Cl.
*H03F 3/24* (2006.01)
*H04B 1/04* (2006.01)

(52) U.S. Cl.
CPC ............... *H03F 3/245* (2013.01); *H04B 1/04* (2013.01); *H03F 2200/451* (2013.01); *H04B 2001/0416* (2013.01)

(58) Field of Classification Search
None
See application file for complete search history.

(56) References Cited

U.S. PATENT DOCUMENTS

| | | | | |
|---|---|---|---|---|
| 6,297,694 | B1 * | 10/2001 | Yamamoto | H03F 3/211 330/134 |
| 6,424,225 | B1 | 7/2002 | Choi et al. | |
| 6,559,722 | B1 | 5/2003 | Lopez et al. | |
| 6,617,928 | B2 | 9/2003 | Finlay et al. | |
| 6,639,465 | B2 | 10/2003 | Samelis et al. | |
| 6,765,439 | B2 * | 7/2004 | Choi | H03F 1/0261 330/129 |
| 6,937,102 | B2 | 8/2005 | Lopez et al. | |
| 6,961,554 | B1 | 11/2005 | Constantin | |
| 7,248,111 | B1 | 7/2007 | Xu et al. | |
| 7,414,479 | B2 | 8/2008 | Ripley et al. | |

(Continued)

*Primary Examiner* — Andrea Lindgren Baltzell
*Assistant Examiner* — Malane Lieng
(74) *Attorney, Agent, or Firm* — Knobbe, Martens, Olson & Bear, LLP

(57) ABSTRACT

Power amplifier systems with a switchable transistor array and a switchable biasing circuit are provided herein. In certain embodiments, a power amplifier system includes a power amplifier that amplifies an RF signal, and a biasing circuit that controls a bias of the power amplifier. The power amplifier includes a transistor array in which a number of active transistors that amplify the RF signal changes based on a selected power mode of the power amplifier system. Additionally, the biasing circuit changes the bias of power amplifier based on the selected power mode. For instance, the biasing circuit can change an amount of bias current and/or a bias voltage level of the power amplifier based on the selected power mode, for instance, a low power mode or a high power mode.

20 Claims, 11 Drawing Sheets

(56) References Cited

U.S. PATENT DOCUMENTS

| | | | | |
|---|---|---|---|---|
| 7,554,407 | B2 * | 6/2009 | Hau | H03F 3/72 455/73 |
| 7,876,157 | B1 | 1/2011 | Kang et al. | |
| 8,497,736 | B1 | 7/2013 | Leipold et al. | |
| 9,413,313 | B2 | 8/2016 | Banowetz et al. | |
| 9,419,567 | B2 | 8/2016 | Ripley et al. | |
| 9,608,576 | B2 | 3/2017 | Lam | |
| 9,621,119 | B2 | 4/2017 | Lehtola | |
| 9,634,619 | B2 | 4/2017 | Gerard et al. | |
| 9,893,686 | B2 | 2/2018 | Ripley | |
| 9,893,687 | B2 | 2/2018 | Lehtola | |
| 9,935,593 | B2 | 4/2018 | Lyalin | |
| 10,008,983 | B2 | 6/2018 | Quaglietta | |
| 10,116,274 | B2 | 10/2018 | Ripley et al. | |
| 10,511,272 | B2 | 12/2019 | Lyalin | |
| 11,165,392 | B2 | 11/2021 | Lehtola | |
| 11,239,800 | B2 | 2/2022 | Drogi et al. | |
| 11,444,576 | B2 | 9/2022 | Drogi et al. | |
| 11,451,199 | B2 | 9/2022 | Ripley et al. | |
| 11,683,013 | B2 | 6/2023 | Drogi et al. | |
| 2022/0021340 | A1 | 1/2022 | Lehtola | |
| 2023/0095390 | A1 | 3/2023 | Lehtola | |

* cited by examiner

POWER AMPLIFIER SYSTEMS WITH SWITCHABLE TRANSISTOR ARRAY AND SWITCHABLE BIASING CIRCUIT

CROSS-REFERENCE TO RELATED APPLICATIONS

This application claims the benefit of priority under 35 U.S.C. § 119 of U.S. Provisional Patent Application No. 63/367,972, filed Jul. 8, 2022 and titled "POWER AMPLIFIER SYSTEMS WITH SWITCHABLE TRANSISTOR ARRAY AND SWITCHABLE BIASING CIRCUIT," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a mobile device. The mobile device includes a transceiver configured to generate a radio frequency input signal, and a front-end system including a power amplifier system operable in selected power mode chosen from a plurality of power modes. The power amplifier system includes a power amplifier having a transistor array configured to amplify the radio frequency input signal to generate a radio frequency output signal, and a power amplifier biasing circuit configured to control both a number of active transistors of the transistor array and a bias of the power amplifier based on the selected power mode.

In some embodiments, the mobile device further includes an antenna configured to transmit the radio frequency output signal.

In various embodiments, the transistor array includes a first power amplifier transistor and a second power amplifier transistor electrically connected in parallel between an input that receives the radio frequency input signal and an output that provides the radio frequency output signal. According to a number of embodiments, the power amplifier biasing circuit is configured to activate both the first power amplifier transistor and the second power amplifier transistor in a first power mode of the two or more power modes, and to activate the second power amplifier transistor and deactivate the first power amplifier transistor in a second power mode of the two or more power modes. In accordance with several embodiments, the power amplifier biasing circuit is configured to bias the first power amplifier transistor with a first bias signal, and to bias the second power amplifier transistor with a second bias signal. According to some embodiments, a bias level of the second bias signal is higher in the first power mode relative to the second power mode. In accordance with a number of embodiments, the first power amplifier transistor is a first bipolar transistor having a base configured to receive the first bias signal, and the second power amplifier transistor is a second bipolar transistor having a base configured to receive the second bias signal. According to several embodiments, the first power amplifier transistor is a first field effect transistor having a gate configured to receive the first bias signal, and the second power amplifier transistor is a second field effect transistor having a gate configured to receive the second bias signal. In accordance with some embodiments, the first power mode is a high power mode and the second power mode is a low power mode.

In a number of embodiments, the power amplifier biasing circuit is configured to receive the mode control signal over a serial interface.

In various embodiments, the two or more power modes include a high power envelope tracking mode, a mid power envelope tracking mode, a high power average power tracking mode, and a low power average power tracking mode.

In several embodiments, the two or more power modes includes a first power mode, a second power mode, and a third power mode, and the transistor array includes a first power amplifier transistor and a second power amplifier transistor. According to a number of embodiments, the power amplifier biasing circuit is configured to activate the second power amplifier transistor in the first power mode, the second power mode, and the third power mode, and to activate the first power amplifier transistor in the first power mode and the second power mode but not in the third power mode. In accordance with several embodiments, the power amplifier biasing circuit provides a bias current to the second power amplifier transistor that is different for each of the first power mode, the second power mode, and the third power mode.

In certain embodiments, the present disclosure relates to a power amplifier system. The power amplifier system includes a power amplifier including an input configured to receive a radio frequency input signal, an output configured to provide a radio frequency output signal, and a transistor array electrically connected between the input and the output and configured to provide amplification to the radio frequency input signal. The power amplifier system further includes a power amplifier biasing circuit configured to receive a mode control signal indicating a selected power mode chosen from two or more power modes, the power amplifier biasing circuit configured to control both a number of active transistors of the transistor array and a bias of the power amplifier based on the selected power mode.

In some embodiments, the transistor array includes a first power amplifier transistor and a second power amplifier transistor electrically connected in parallel between the input and the output. According to a number of embodiments, the power amplifier biasing circuit is configured to activate both the first power amplifier transistor and the second power amplifier transistor in a first power mode of the two or more power modes, and to activate the second power amplifier transistor and deactivate the first power amplifier transistor in a second power mode of the two or more power modes. In accordance with several embodiments, the power amplifier biasing circuit is configured to bias the first power amplifier transistor with a first bias signal, and to bias the second power amplifier transistor with a second bias signal. According to various embodiments, a bias level of the second bias signal is higher in the first power mode relative to the second power mode. In accordance with one or more embodiments, the first power amplifier transistor is a first bipolar transistor having a base configured to receive the first bias signal, and the second power amplifier transistor is a second bipolar transistor having a base configured to receive the second bias signal. According to several embodiments, the first power amplifier transistor is a first field effect transistor having a gate configured to receive the first bias signal, and the second power amplifier transistor is a second field effect transistor having a gate configured to receive the second bias signal. In accordance with various embodiments, the first power mode is a high power mode and the second power mode is a low power mode.

In a number of embodiments, the two or more power modes includes a high power envelope tracking mode, a mid power envelope tracking mode, a high power average power tracking mode, and a low power average power tracking mode.

In several embodiments, the power amplifier biasing circuit is configured to receive the mode control signal over a serial interface.

In various embodiments, the two or more power modes includes a first power mode, a second power mode, and a third power mode, and the transistor array includes a first power amplifier transistor and a second power amplifier transistor.

In some embodiments, the power amplifier biasing circuit is configured to activate the second power amplifier transistor in the first power mode, the second power mode, and the third power mode, and to activate the first power amplifier transistor in the first power mode and the second power mode but not in the third power mode. According to several embodiments, the power amplifier biasing circuit provides a bias current to the second power amplifier transistor that is different for each of the first power mode, the second power mode, and the third power mode.

In certain embodiments, the present disclosure relates to a method of power amplifier biasing. The method includes amplifying a radio frequency input signal using a transistor array of a power amplifier, receiving a mode control signal indicating a selected power mode chosen from two or more power modes, and controlling both a number of active transistors of the transistor array and a bias of the power amplifier based on the selected power mode using a power amplifier biasing circuit.

In some embodiments, the method further comprising activating both a first power amplifier transistor and a second power amplifier transistor of the transistor array in a first power mode of the two or more power modes, and activating the second power amplifier transistor and deactivating the first power amplifier transistor in a second power mode of the two or more power modes. According to several embodiments, the method further includes biasing the first power amplifier transistor with a first bias signal from the power amplifier biasing circuit, and biasing the second power amplifier transistor with a second bias signal from the power amplifier biasing circuit. In accordance with various embodiments, the method further includes generating the second bias signal with a higher bias level in the first power mode relative to the second power mode. According to a number of embodiments, the first power amplifier transistor and the second power amplifier transistor are bipolar transistors, and the method further includes biasing a base of the first power amplifier transistor with the first bias signal and biasing a base of the second power amplifier transistor with the second bias signal. In accordance with several embodiments, the first power amplifier transistor and the second power amplifier transistor are field effect transistors, and the method further includes biasing a gate of the first power amplifier transistor with the first bias signal and biasing a gate of the second power amplifier transistor with the second bias signal. According to various embodiments, the first power mode is a high power mode and the second power mode is a low power mode.

In several embodiments, the method further includes receiving the mode control signal over a serial interface.

DETAILED DESCRIPTION OF EMBODIMENTS

Figure 1:
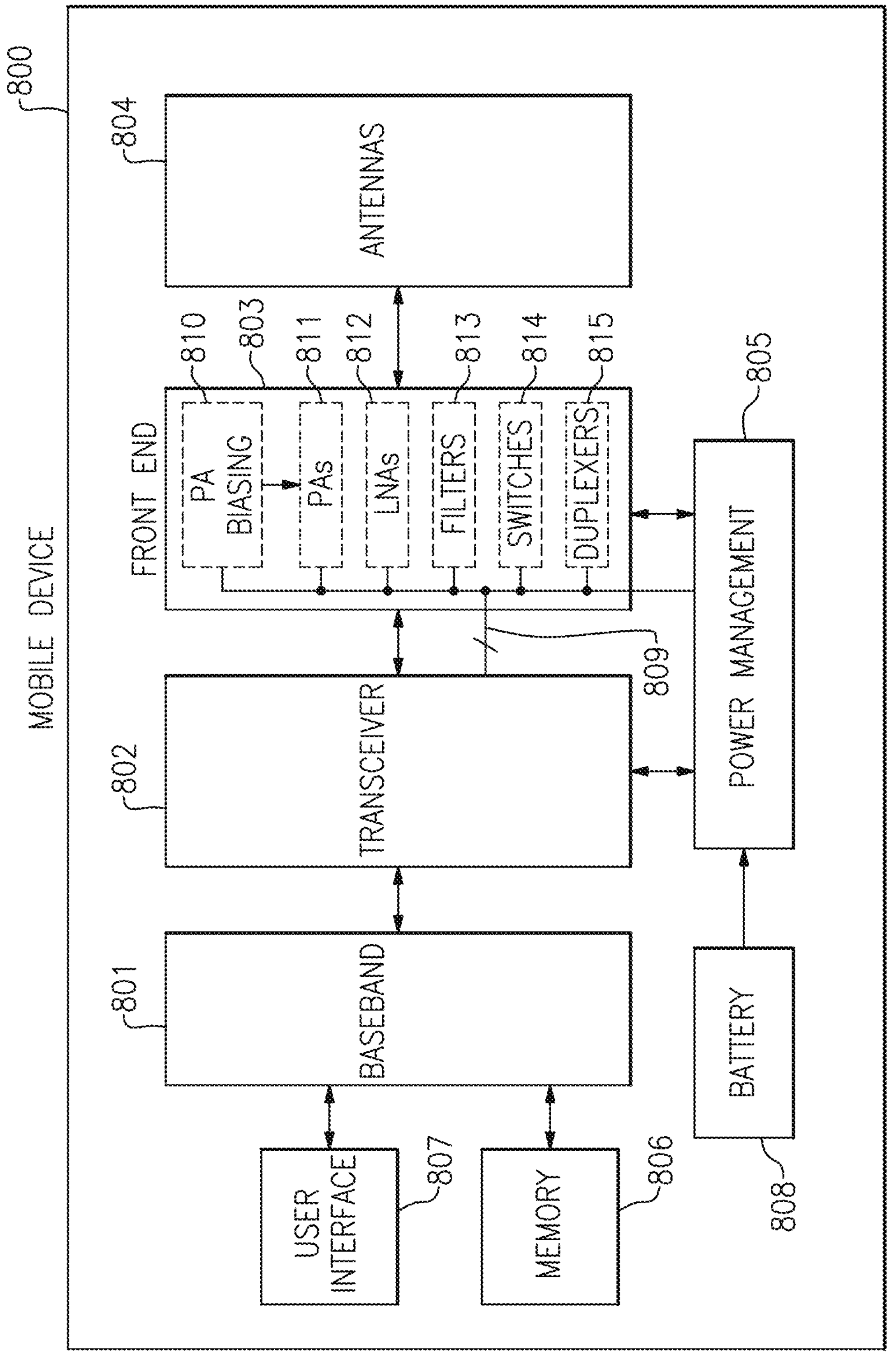
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In mobile applications, such as cellular communication systems, it is important to prolong battery lifetime. One operation that consumes a significant amount of battery charge is power amplification.

To aid in controlling transmit power level and/or power consumption, a power amplifier can operate in multiple power modes associated with different output power levels or ranges. In one example, a power amplifier is operable in multiple output power ranges including at least a high output power range and a low output power range that is lower than the high output power range.

When implementing a power amplifier with multiple power modes, it is desirable for the power amplifier to be power efficient when operating in each of the power modes. For example, in mobile applications, a power amplifier that is power efficient in both a high output power range and a low output power range is desirable.

To increase power efficiency and reduce DC power consumption, a bias current of a power amplifier can be decreased when transitioning the power amplifier from a high power mode to a low power mode. However, reducing bias current alone can lead to a degradation of other operating parameters of the power amplifier, such as linearity.

Power amplifier systems with a switchable transistor array and a switchable biasing circuit are provided herein. In certain embodiments, a power amplifier system includes a power amplifier that amplifies an RF signal, and a biasing circuit that controls a bias of the power amplifier. The power amplifier includes a transistor array in which a number of active transistors that amplify the RF signal changes based on a selected power mode of the power amplifier system. Additionally, the biasing circuit changes the bias of power amplifier based on the selected power mode. For instance, the biasing circuit can change an amount of bias current and/or a bias voltage level of the power amplifier based on the selected power mode, for instance, a low power mode or a high power mode.

Accordingly, both a number of active transistor elements of a power amplifier and a biasing circuit of the power amplifier are switched based on the chosen power mode.

By implementing the power amplifier system in this manner, decreased power consumption is achieved while maintaining performance of other power amplifier parameters, such as linearity. Accordingly, the teachings herein can be used to reduce or eliminate a tradeoff between power efficiency and linearity.

In certain implementations, the power amplifier system is implemented on a semiconductor die that includes a serial interface, such as a mobile industry processor interface radio frequency front-end (MIPI RFFE) bus. Additionally, switching of the number of active transistor elements of the power amplifier and switching of the bias of the power amplifier is controlled by a control command or word (for instance, a MIPI word) sent to the biasing circuit via the serial interface.

FIG. 1 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

Although the mobile device 800 illustrates one example of an RF system that can include one or more features of the present disclosure, the teachings herein are applicable to electronic systems implemented in a wide variety of ways.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 1 as the transceiver 802. In one example, separate components (for instance, separate circuits or dies) can be provided for handling certain types of RF signals.

As shown in in FIG. 1, the transceiver 802 is connected to the front end system 803 and to the power management circuit 805 using a serial interface 809. All or part of the illustrated RF components can be controlled by the serial interface 809 to configure the mobile device 800 during initialization and/or while fully operational. In another embodiment, the baseband processor 801 is additionally or alternative connected to the serial interface 809 and operates to configure one or more RF components, such as components of the front end system 803, and/or power management system 805.

The front end system 803 aids is conditioning signals transmitted to and/or received from the antennas 804. In the illustrated embodiment, the front end system 803 includes one or more power amplifier biasing circuits 810 for controlling power amplifier biasing, one or more power amplifiers (PAs) 811, one or more low noise amplifiers (LNAs) 812, one or more filters 813, one or more switches 814, and one or more duplexers 815. However, other implementations are possible. As shown in FIG. 1, the one or more power amplifier biasing circuits 810 provide at least one bias signal to the one or more power amplifiers 811.

With continuing reference to FIG. 1, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The power amplifier biasing circuit(s) 810 and power amplifier(s) 811 can be implemented in accordance with any of the embodiments herein. Although the mobile device 800 of FIG. 1 illustrates one embodiment of an RF communication system that can include a power amplifier system with a switchable transistor array and switchable biasing, the teachings herein are applicable to RF communication systems implemented in a wide variety of ways.

In certain implementations, the mobile device 800 supports carrier aggregation, thereby providing flexibility to increase peak data rates. Carrier aggregation can be used for both Frequency Division Duplexing (FDD) and Time Division Duplexing (TDD) and may be used to aggregate a plurality of carriers or channels. Carrier aggregation includes contiguous aggregation, in which contiguous carriers within the same operating frequency band are aggregated. Carrier aggregation can also be non-contiguous and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 1, the baseband system 801 is coupled to the memory 806 and the user interface 807 to facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a power amplifier (PA) supply control circuit that controls the supply voltages of the power amplifiers 811 over time, for instance, using average power tracking (APT) and/or envelope tracking (ET). As shown in FIG. 1, the power management system 805 is connected to the serial interface 809 to facilitate communications with other components and systems of the mobile device 801.

As shown in FIG. 1, the power management system 805 receives a battery voltage from the battery 808. The battery 808 can be any suitable battery for use in the mobile device 800, including, for example, a lithium-ion battery. Although the power management system 805 is illustrated as separate from the front end system 803, in certain implementations all or part (for instance, a PA supply control circuit) of the power management system 805 is integrated into the front end system 803.

Figure 2:
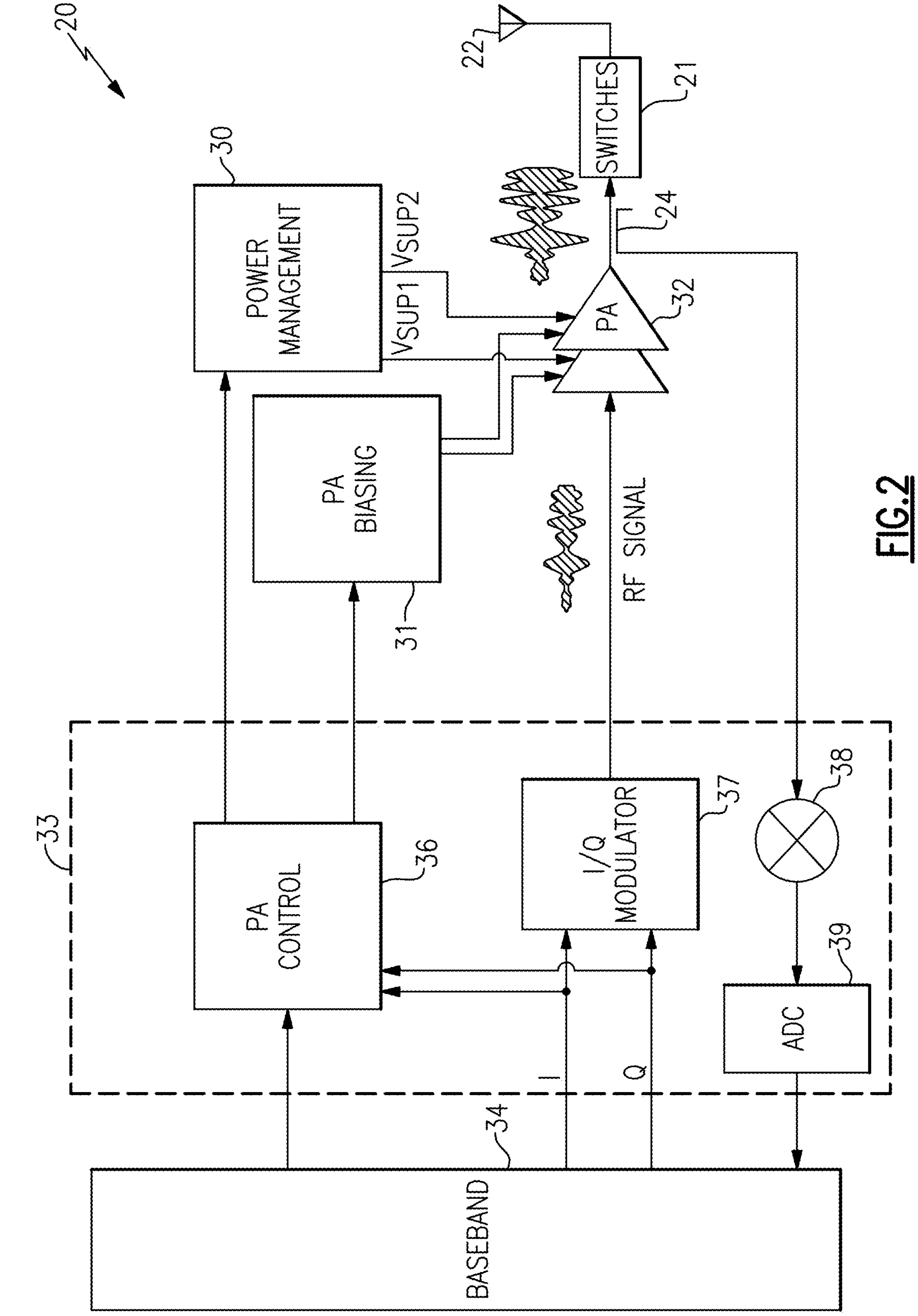
FIG. 2 is a schematic diagram of one embodiment of a power amplifier system.

FIG. 2 is a schematic diagram of one embodiment of a power amplifier system 20. The illustrated power amplifier system 20 includes switches 21, an antenna 22, a directional coupler 24, a power management circuit 30, a power amplifier biasing circuit 31, a power amplifier 32, a transceiver 33, and a baseband processor 34.

The power amplifier biasing circuit 31 and the power amplifier 32 can be implemented in accordance with any of the embodiments herein. Although the power amplifier system 20 of FIG. 2 illustrates one embodiment of a power amplifier system that can be implemented with a switchable transistor array and switchable biasing, the teachings herein are applicable to power amplifier systems implemented in a wide variety of ways. For example, a power amplifier system can include more or fewer components, a different arrangement of components, and/or components implemented in different ways.

In the illustrated embodiment, the transceiver 33 includes a power amplifier control circuit 36, an I/Q modulator 37, a mixer 38, and an analog-to-digital converter (ADC) 39. Although not illustrated in FIG. 2 for clarity, the transceiver 33 can also process signals received from one or more antennas (for example, the antenna 22 and/or other antenna(s)) by way of one or more receive paths. Furthermore, the transceiver 33 can be implemented in other ways, including, but not limited to, using different implementations of transmit path(s), observation path(s), and/or power amplifier control circuitry.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 37 in a digital format. The baseband processor 34 can be any suitable processor or set of processors configured to process a baseband signal. For instance, the baseband processor 34 can include a digital signal processor, a microprocessor, a programmable core, or any combination thereof. Moreover, in some implementations, two or more baseband processors 34 can be included in the power amplifier system 20.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier 32 can receive the RF signal from the I/Q modulator 37, and when enabled can provide an amplified RF signal to the antenna 22 via the switches 21. The directional coupler 24 can be positioned between the output of the power amplifier 32 and the input of the switches 21, thereby allowing an output power measurement of the power amplifier 32 that does not include insertion loss of the switches 21. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 20. For example, configuring the power amplifier system 20 in this manner can aid in controlling the power added efficiency (PAE) and/or linearity of the power amplifier 32.

In the illustrated embodiment, the power management circuit 30 controls the supply voltages of the power amplifier 32. As shown in FIG. 2, the power management circuit 30 generates a first supply voltage $V_{SUP1}$ for powering an input stage of the power amplifier 32 and a second supply voltage $V_{SUP2}$ for powering an output stage of the power amplifier 32. Although an embodiment with two controllable supply voltages is shown, a power management circuit can control the voltage levels of more or fewer supply voltages. In certain implementations, a power amplifier operates with one or more controllable supply voltages and one or more substantially fixed supply voltages.

In certain implementations, the transceiver 33 is electrically connected to the power management circuit 30 via a serial interface, and operation of the power management circuit 30 is based on data received from the transceiver 33 over the serial interface. For example, the transceiver 33 can instruct the power management circuit 30 to control one or more supply voltages in a particular manner, such as APT, ET, regulation to provide a fixed voltage, or a combination thereof.

As shown in FIG. 2, the power amplifier biasing circuit 31 receives a power mode signal from the transceiver 33, and controls biasing of the power amplifier 32 based on the power mode signal. For example, to aid in controlling transmit power level and/or power consumption, the power amplifier system 20 can be operable in multiple power modes associated with different output power levels or ranges. In the illustrated embodiment, the chosen power mode is indicated by the power mode signal provided to the power amplifier biasing circuit 31 from the transceiver 33.

Figure 3A:
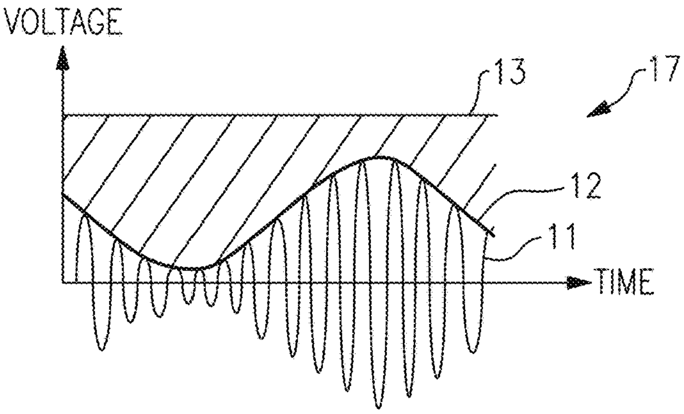
FIG. 3A is a graph showing a first example of power amplifier supply voltage versus time.

FIG. 3A is a graph 17 showing a first example of power amplifier supply voltage versus time. The graph 17 illustrates the voltage of an RF signal 11, the RF signal's envelope 12, and a power amplifier supply voltage 13 versus time. The graph 17 corresponds to one example of waveforms for an implementation in which the power amplifier supply voltage 13 is substantially fixed.

It can be important that the power amplifier supply voltage 13 of a power amplifier has a voltage greater than that of the RF signal 11. For example, powering a power amplifier using a power amplifier supply voltage that has a magnitude less than that of the RF signal can clip the RF signal, thereby creating signal distortion and/or other problems. Thus, it can be important the power amplifier supply voltage 13 be greater than that of the envelope 12. However, it can be desirable to reduce a difference in voltage between the power amplifier supply voltage 13 and the envelope 12 of the RF signal 11, as the area between the power amplifier supply voltage 13 and the envelope 12 can represent lost energy, which can reduce battery life and increase heat generated in a wireless device.

Figure 3B:
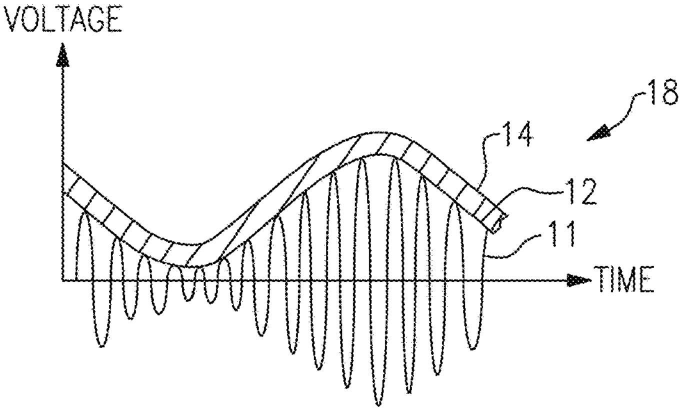
FIG. 3B is a graph showing a second example of power amplifier supply voltage versus time.

FIG. 3B is a graph 18 showing a second example of power amplifier supply voltage versus time. The graph 18 illustrates the voltage of an RF signal 11, the RF signal's envelope 12, and a power amplifier supply voltage 14 versus time. The graph 18 corresponds to one example of waveforms for an implementation in which the power amplifier supply voltage 14 is generated by envelope tracking.

Envelope tracking is a technique that can be used to increase PAE of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 13 of FIG. 3A, the power amplifier supply voltage 14 of FIG. 3B changes in relation to the envelope 12 of the RF signal 11. The area between the power amplifier supply voltage 14 and the envelope 12 in FIG. 3B is less than the area between the power amplifier supply voltage 13 and the envelope 12 in FIG. 3A, and thus the graph 18 of FIG. 3B can be associated with a power amplifier system having greater energy efficiency.

Figure 3C:
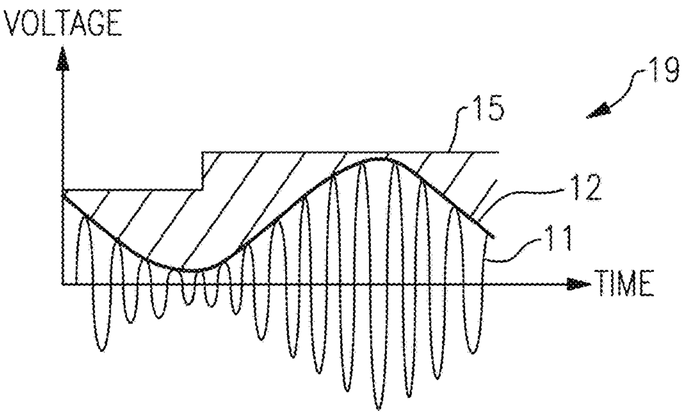
FIG. 3C is a graph showing a third example of power amplifier supply voltage versus time.

FIG. 3C is a graph 19 showing a third example of power amplifier supply voltage versus time. The graph 19 illustrates the voltage of an RF signal 11, the RF signal's envelope 12, and a power amplifier supply voltage 15 versus time. The graph 19 corresponds to one example of waveforms for an implementation in which the power amplifier supply voltage 15 is generated by APT.

APT is one technique for improving efficiency of a power amplifier, in which the voltage level of a power amplifier's supply voltage is controlled based on a power amplifier's average output power. When operating using APT, the voltage level of the power amplifier supply voltage can be substantially fixed for a particular time slot but adjusted for a subsequent time slot based on average output power (for instance, transmission power control level). APT can achieve gain in efficiency relative to a fixed power amplifier supply voltage, but less efficiency gain compared to envelope tracking. However, envelope tracking can have a higher complexity, cost, and/or overhead relative to APT.

Figure 4:
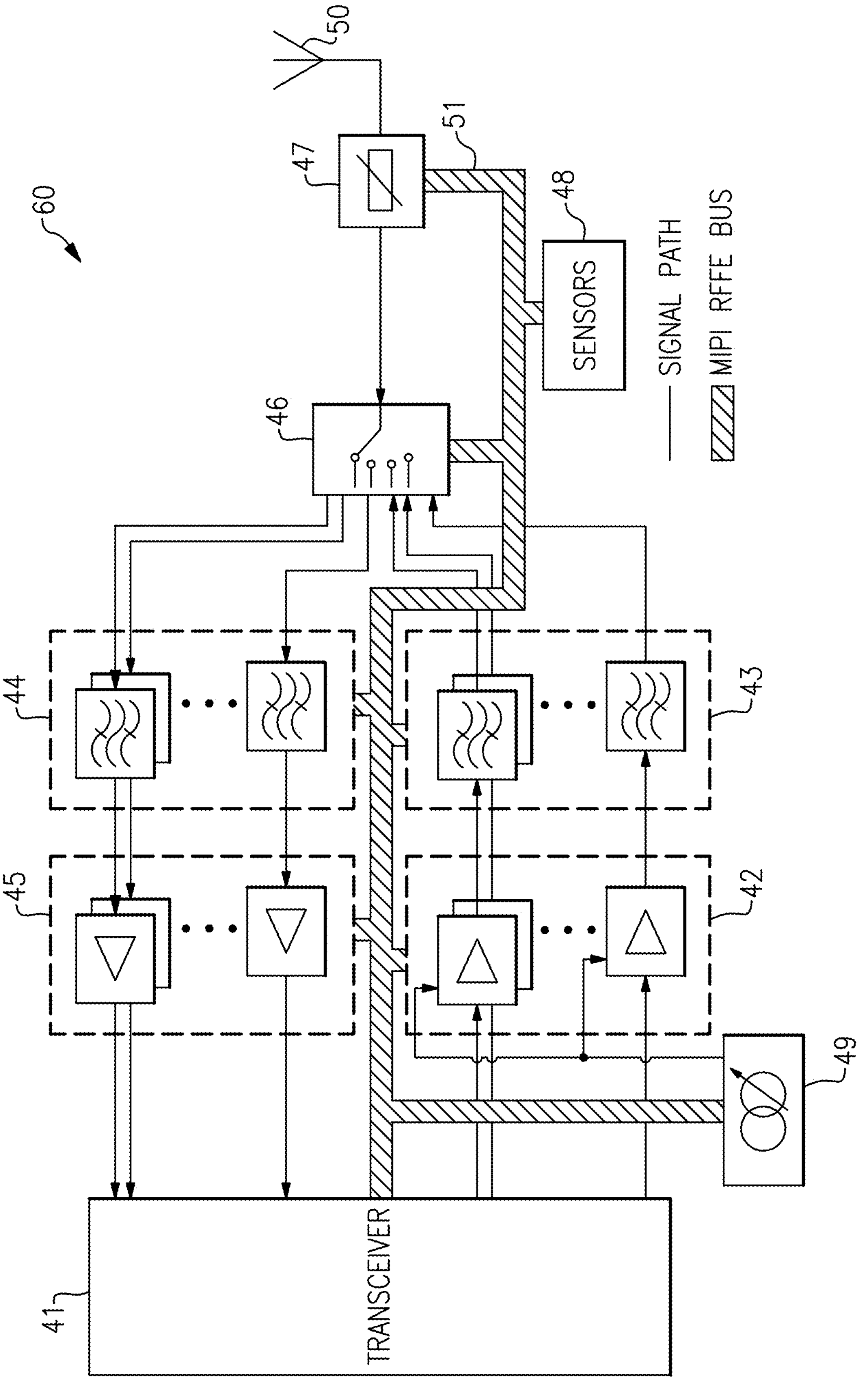
FIG. 4 is a schematic diagram of one embodiment of an RF communication system.

FIG. 4 is a schematic diagram of one embodiment of an RF communication system 60 including a MIPI RFFE bus 51. The RF communication system 60 further includes a transceiver 41, a power amplifier module 42, a transmit filter module 43, a receive filter module 44, a low noise amplifier (LNA) module 45, an antenna switch module 46, a coupler module 47, a sensor module 48, a power management module 49, and an antenna 50.

As shown in FIG. 4, various components of the RF communication system 60 are interconnected by the MIPI RFFE bus 51. Additionally, the transceiver 41 includes a master device of the MIPI RFFE bus 51, and each of the RF components includes a slave device of the MIPI RFFE bus 51. The master device of the transceiver 41 sends control commands over the MIPI RFFE bus 51 to configure the RF communication system 60 during initialization and/or while operational.

The power amplifier module 42 can include a power amplifier and a power amplifier biasing circuit that controls biasing of the power amplifier. Additionally, the power amplifier biasing circuit can include a slave device of the MIPI RFFE bus 51. The power amplifier module 42 and the power management module 49 can be implemented in accordance with one or more features of the present disclosure. As shown in FIG. 4, the power amplifier module 42 receives one or more power amplifier supply voltages and/or bias signals from the power management module 49.

Although FIG. 4 illustrates one example of an RF communication system that can include a power amplifier module controlled over a serial interface, the teachings herein are applicable to RF communication systems implemented in a wide variety of ways.

Figure 5A:
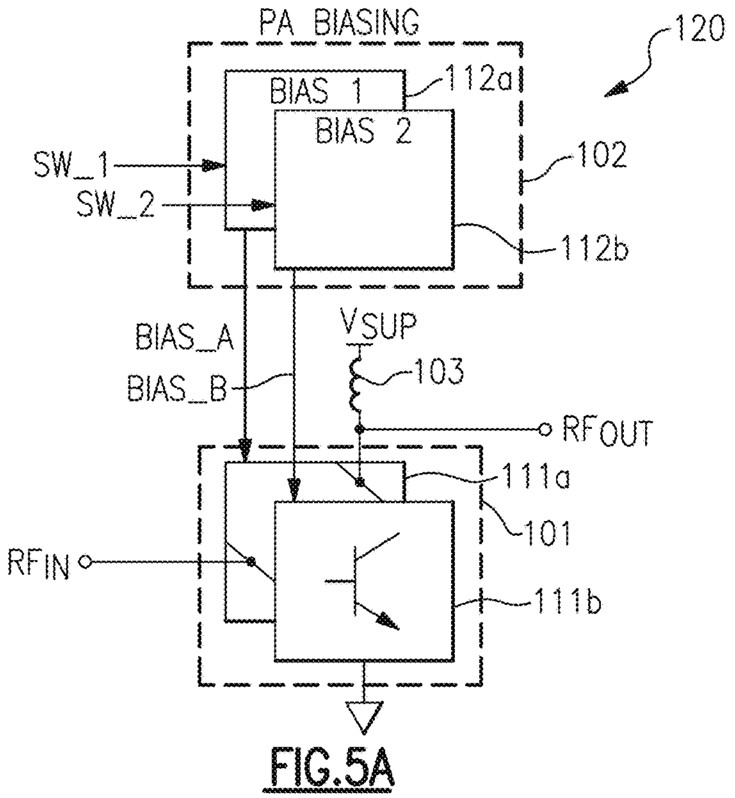
FIG. 5A is a schematic diagram of another embodiment of a power amplifier system.

FIG. 5A is a schematic diagram of another embodiment of a power amplifier system 120. The power amplifier system 120 includes a power amplifier 101, a power amplifier biasing circuit 102, and a supply voltage inductor 103.

As shown in FIG. 5A, the power amplifier 101 operates to amplify an RF input signal $RF_{IN}$ to generate an RF output signal $RF_{OUT}$. The power amplifier 101 includes a transistor array including a first power amplifier transistor 111a and a second power amplifier transistor 111b, which are implemented as bipolar transistors, in this embodiment. The bases of the power amplifier transistors receive the RF input signal $RF_{IN}$, while the emitters of the power amplifier transistors are electrically connected to ground. Additionally, the collectors of the power amplifier transistors receive a power supply voltage $V_{SUP}$ by way of the supply voltage inductor 103, which serves to provide the power supply voltage $V_{SUP}$ to the power amplifier transistors while choking or blocking the RF output signal $RF_{OUT}$. The collectors of the power amplifier transistors are also connected to an output for providing the RF output signal $RF_{OUT}$.

In the illustrated embodiment, the power amplifier biasing circuit 102 includes a first bias circuit 112a and a second bias circuit 112b. Additionally, the power amplifier biasing circuit 102 is controlled by a first switch signal SW_1 and a second switch signal SW_2 that indicate the power mode of the power amplifier system 120. As shown in FIG. 5A, the first bias circuit 112a generates a first bias signal BIAS_A for the base of the first power amplifier transistor 111a, and the second bias circuit 112b generates a second bias signal BIAS_B for the base of the second power amplifier transistor 111b.

With continuing reference to FIG. 5A, the first bias signal BIAS_A and the second bias signal BIAS_B serve to control both a number of activated transistors of the power amplifier 101, and to control a bias level (for instance, an amount of current and/or voltage level) of the first bias signal BIAS_A and the second bias signal BIAS_B. When a particular power amplifier transistor is activated, the transistor serves to amplify the RF input signal $RF_{IN}$. However, when a particular power amplifier transistor is deactivated, the transistor provides substantially no amplification to the RF input signal $RF_{IN}$ and is biased to reduce current consumption.

Accordingly, as the power mode indicated by the first switch signal SW_1 and the second switch signal SW_2 changes, a number of active transistors of the power amplifier 101 that amplify the RF input signal $RF_{IN}$ also changes. In certain implementations, both the first power amplifier transistor 111a and the second power amplifier transistor 111b are activated in a first power mode (for instance, a high power mode), while the first power amplifier transistor 111a is deactivated and the second power amplifier transistor 111b is activated in a second power mode (for instance, a low power mode).

Furthermore, the biasing circuit changes the bias of power amplifier 101 based on the selected power mode. For example, the bias level of second power amplifier transistor 101b can change from one power mode (for instance, a high power mode) to another mode (for instance, a low power mode) while being active to amplify the RF input signal $RF_{IN}$ in both power modes. For example, the bias level can increase in the high power mode relative to the low power mode.

Thus, the power amplifier biasing circuit 102 can change an amount of bias current and/or a bias voltage level of one or more of the bias signals based on the power mode indicated by the first switch signal SW_1 and the second switch signal SW_2.

Accordingly, both a number of active transistor elements of the power amplifier 101 and a bias of the power amplifier 101 are switched based on the chosen power mode of the power amplifier system 120. By implementing the power amplifier system 120 in this manner, decreased power consumption is achieved while maintaining performance of other power amplifier parameters, such as linearity.

In certain implementations, the power amplifier system 120 receives the first switch signal SW_1 and the second switch signal SW_2 by way of a serial interface, such as a MIPI RFFE bus.

Figure 5B:
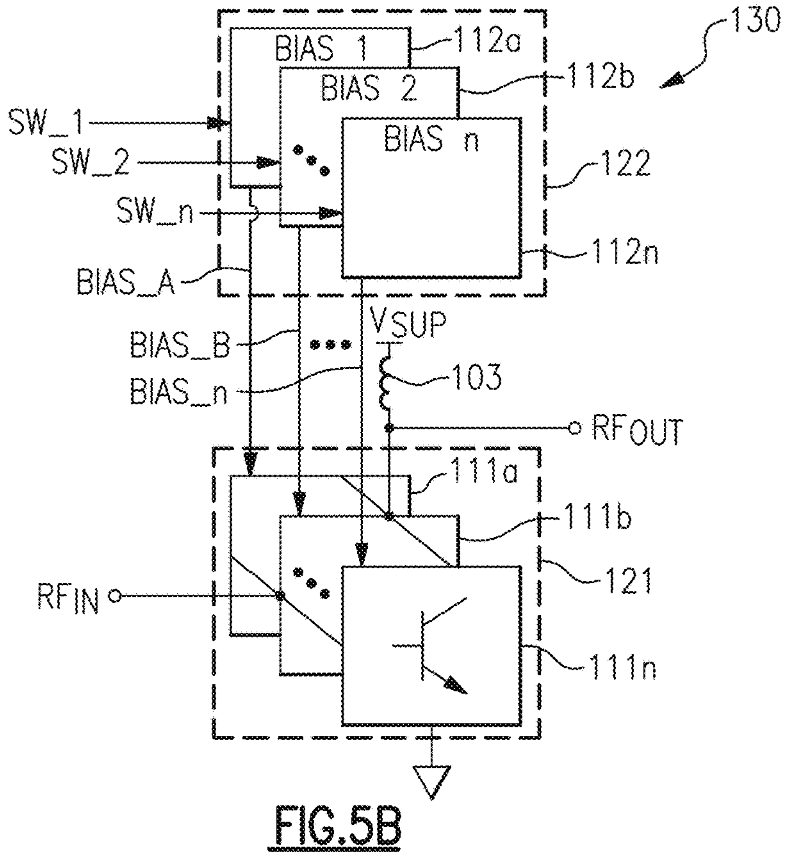
FIG. 5B is a schematic diagram of another embodiment of a power amplifier system.

FIG. 5B is a schematic diagram of another embodiment of a power amplifier system 130. The power amplifier system 130 includes a power amplifier 121, a power amplifier biasing circuit 122, and a supply voltage inductor 103.

The power amplifier system 130 of FIG. 5B is similar to the power amplifier system 120 of FIG. 5A, except that the power amplifier system 130 is implemented with additional power amplifier transistors and bias circuits. For example, the power amplifier 121 includes a transistor array includes power amplifier transistors 111a, 111b, . . . 111n, while the power amplifier biasing circuit 122 includes bias circuits 112a, 112b, . . . 112n that generate bias signals BIAS_A, BIAS_B, . . . BIAS_n for the power amplifier transistors 111a, 111b, 111n, respectively. The number of the power amplifier transistors and bias circuits can be any suitable number n, for instance, 2, 3, or 4 or more.

Figure 5C:
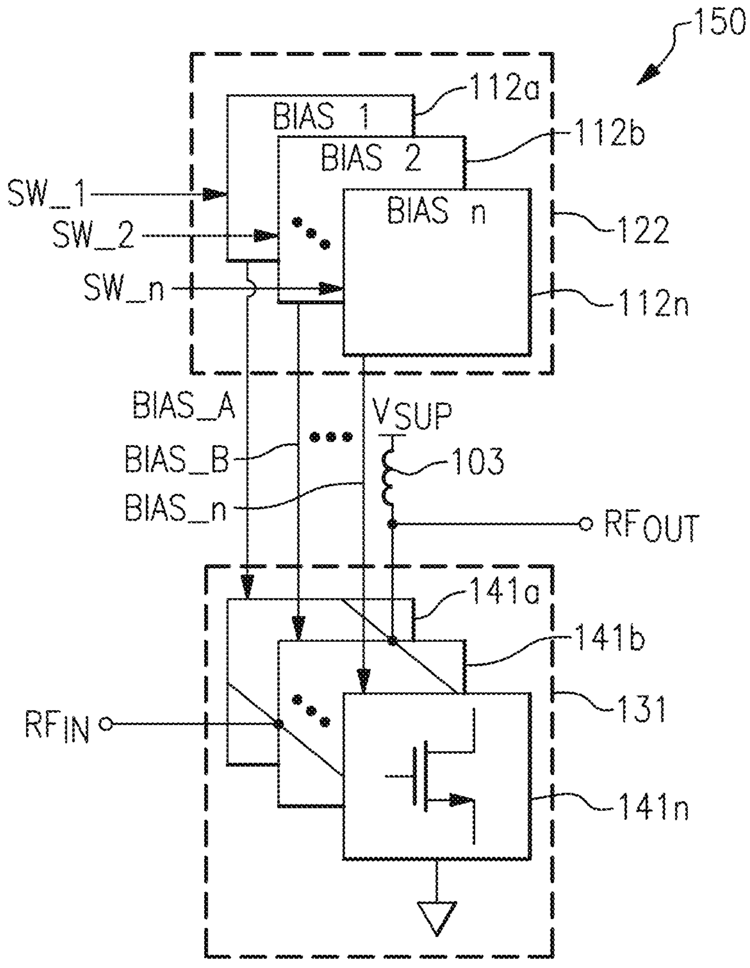
FIG. 5C is a schematic diagram of another embodiment of a power amplifier system.

FIG. 5C is a schematic diagram of another embodiment of a power amplifier system 150. The power amplifier system 150 includes a power amplifier 131, a power amplifier biasing circuit 122, and a supply voltage inductor 103.

The power amplifier system 150 of FIG. 5C is similar to the power amplifier system 130 of FIG. 5B, except that the power amplifier system 150 is implemented with a field-effect transistor (FET) array for amplifying the RF input signal $RF_{IN}$.

For example, as shown in FIG. 5C, the power amplifier 131 includes a transistor array including a FET array of power amplifier transistors 141a, 141b, . . . 141n having gates that receive bias signals BIAS_A, BIAS_B, . . . BIAS_n, respectively. Additionally, the gates of the power amplifier transistors 141a, 141b, . . . 141n are connected to an input that receives the RF input signal $RF_{IN}$, the sources of the power amplifier transistors 141a, 141b, . . . 141n are connected to ground, and the drains of the power amplifier transistors 141a, 141b, . . . 141n are connected to an output that provides the RF output signal $RF_{OUT}$.

Figure 6:
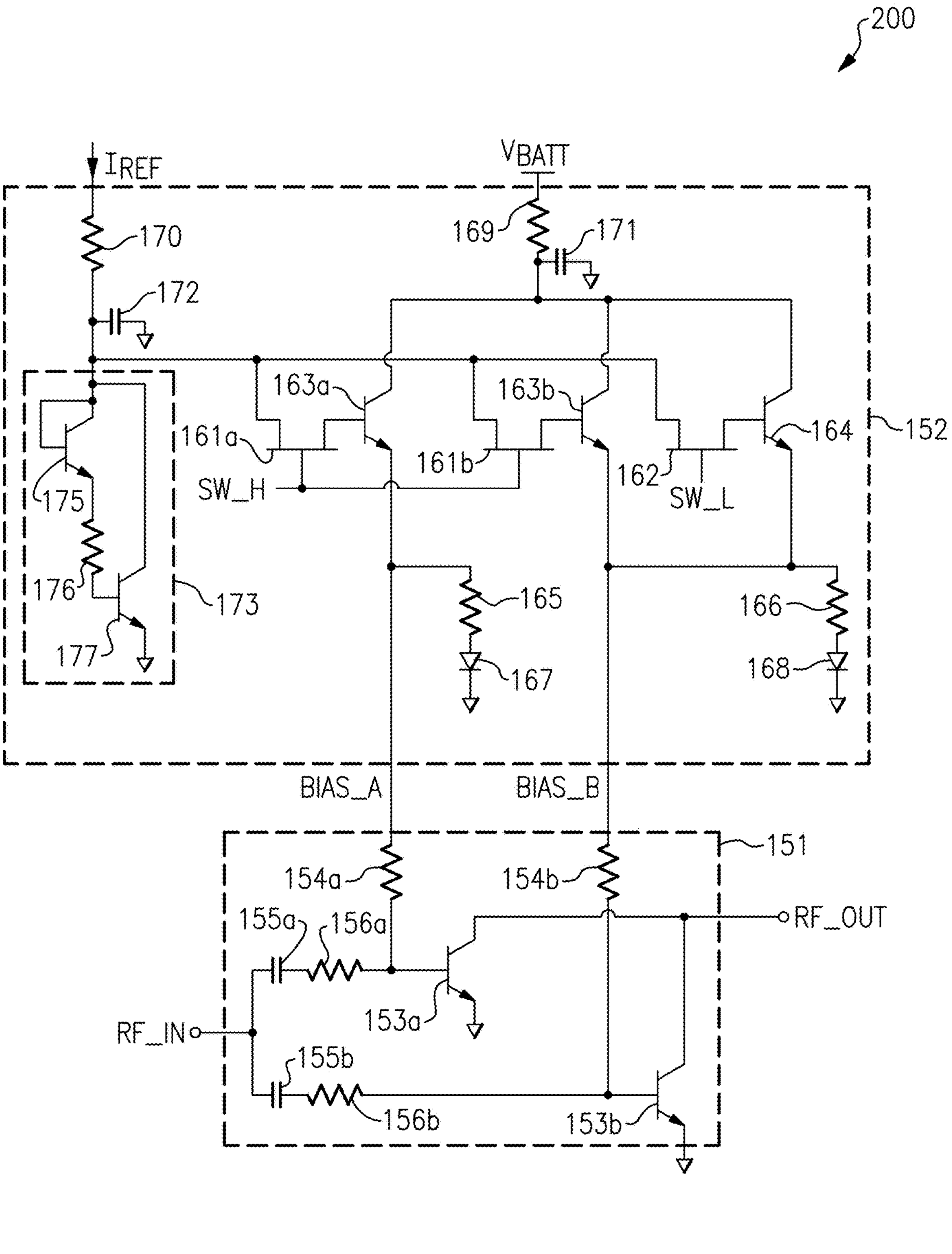
FIG. 6 is a schematic diagram of another embodiment of a power amplifier system.

FIG. 6 is a schematic diagram of another embodiment of a power amplifier system 200. The power amplifier system 200 includes a power amplifier 151 and a power amplifier biasing circuit 152. For clarity of the figure, circuitry for providing a supply voltage to the power amplifier 151 is not depicted. However, the supply voltage can be provided in a variety of ways, such as from a power management circuit by way of an inductor.

In the illustrated embodiment, the power amplifier 151 includes a first power amplifier transistor 153*a*, a second power amplifier transistor 153*b*, a first bias resistor 154*a*, a second bias resistor 154*b*, a first input DC blocking capacitor 155*a*, a second input DC blocking capacitor 155*b*, a first input resistor 156*a*, and a second input resistor 156*b*.

As shown in FIG. 6, the base of the first power amplifier transistor 153*a* receives the RF input signal RF_IN by way of the first input DC blocking capacitor 155*a* and the first input resistor 156*a* and receives the first bias signal BIAS_A from the power amplifier biasing circuit 152 by way of the first bias resistor 154*a*. Additionally, the base of the second power amplifier transistor 153*b* receives the RF input signal RF_IN by way of the second input DC blocking capacitor 155*b* and the second input resistor 156*b* and receives the second bias signal BIAS_B from the power amplifier biasing circuit 152 by way of the second bias resistor 154*b*. Furthermore, the emitters of the first power amplifier transistor 153*a* and the second power amplifier transistor 153*b* are connected to ground, while the collectors of the first power amplifier transistor 153*a* and the second power amplifier transistor 153*b* are connected to an output node that provides the RF output signal RF_OUT. In certain implementations, the collectors of the first power amplifier transistor 153*a* and the second power amplifier transistor 153*b* also receive a common or shared power supply voltage by way of an inductor.

In the illustrated embodiment, the power amplifier biasing circuit 152 includes a first high power mode FET 161*a*, a second high power mode FET 161*b*, a low power mode FET 162, a first high power mode bipolar transistor 163*a*, a second high power mode bipolar transistor 163*b*, a low power mode bipolar transistor 164, a first clamping resistor 165, a second clamping resistor 166, a first clamping diode 167, a second clamping diode 168, a first biasing resistor 169, a second biasing resistor 170, a first decoupling capacitor 171, a second decoupling capacitor 172, and a reference current load 173.

As shown in FIG. 6, the first biasing resistor 169 receives a battery voltage $V_{BATT}$, which is used to power the power amplifier biasing circuit 152. Additionally, the second biasing resistor 170 receives a reference current $I_{REF}$, which can be generated in a wide variety of ways, including, but not limited to, using a temperature compensated current controller. The reference current load 173 includes a first load bipolar transistor 175, a load resistor 176, and a second load bipolar transistor 177, in this example.

In the illustrated embodiment, the first high power mode FET 161*a* and the second high power mode FET 161*b* are controlled by a high power mode signal SW_H indicating whether or not the power amplifier system 200 is in a high power mode. When in the high power mode, the power amplifier biasing circuit 152 generates the first bias signal BIAS_A and the second bias signal BIAS_B to activate both the first power amplifier transistor 153*a* and the second power amplifier transistor 153*b* such that both transistors operate in parallel to amplify the RF input signal RF_IN in the high power mode.

With continuing reference to FIG. 6, the low power mode FET 162 is controlled by a low power mode signal SW_L indicating whether or not the power amplifier system 200 is in a low power mode. When in the low power mode, the power amplifier biasing circuit 152 deactivates the first power amplifier transistor 153*a* using the first bias signal BIAS_A and activates the second power amplifier transistor 153*b* using the second bias signal BIAS_B.

Thus, the number of active power amplifier transistors changes based on the power mode (high power mode or low power mode, in this example).

Moreover, although the second power amplifier transistor 153*b* is active in both the low power mode and the high power mode, the level of the second bias signal BIAS_B (for instance, the amount of bias current delivered to the second power amplifier transistor 153*b* changes based on the power mode. Thus, not only do the number of active power amplifier transistors change based on the power mode, but the bias level of the active transistors also changes based on the power mode.

By implementing the power amplifier system in this manner, decreased power consumption is achieved while maintaining performance of other power amplifier parameters, such as linearity. In contrast, a power amplifier system that reduces bias current alone when changing modes can lead to a degradation of other operating parameters of the power amplifier, such as linearity.

Figure 7A:
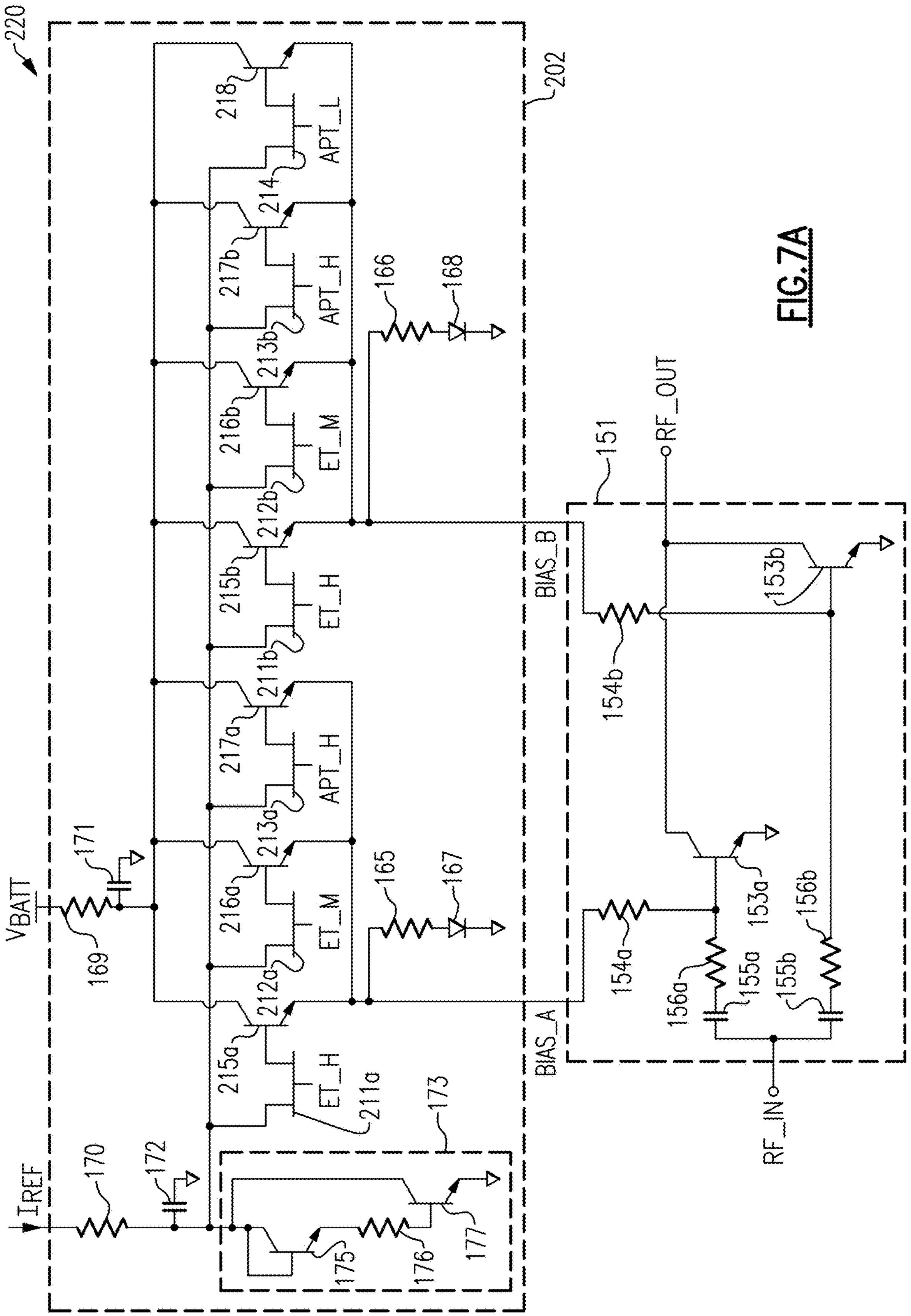
FIG. 7A is a schematic diagram of another embodiment of a power amplifier system.

FIG. 7A is a schematic diagram of another embodiment of a power amplifier system 220. The power amplifier system 220 includes a power amplifier 151 and a power amplifier biasing circuit 202.

The power amplifier system 220 of FIG. 7A is similar to the power amplifier system 200 of FIG. 6, except that the power amplifier biasing circuit 202 is implemented to support additional modes, including a high power ET mode (indicated by control signal ET_H), a mid power ET mode (indicated by control signal ET_M), a high power APT mode (indicated by control signal APT_H), and a low power APT mode (indicated by control signal APT_L). Thus, the power amplifier system 220 is operable in four modes, in this example.

As shown in FIG. 7A, the power amplifier biasing circuit 202 includes a first high power ET mode FET 211*a*, a second high power ET mode FET 211*b*, a first mid power ET mode FET 212*a*, a second mid power ET mode FET 212*b*, a first high power APT mode FET 213*a*, a second high power APT mode FET 213*b*, a low power APT mode FET 214, a first high power ET mode bipolar transistor 215*a*, a second high power ET mode bipolar transistor 215*b*, a first mid power ET mode bipolar transistor 216*a*, a second mid power ET mode bipolar transistor 216*b*, a first high power APT mode bipolar transistor 217*a*, a second high power APT mode bipolar transistor 217*b*, and a low power APT mode bipolar transistor 218.

Figure 7B:
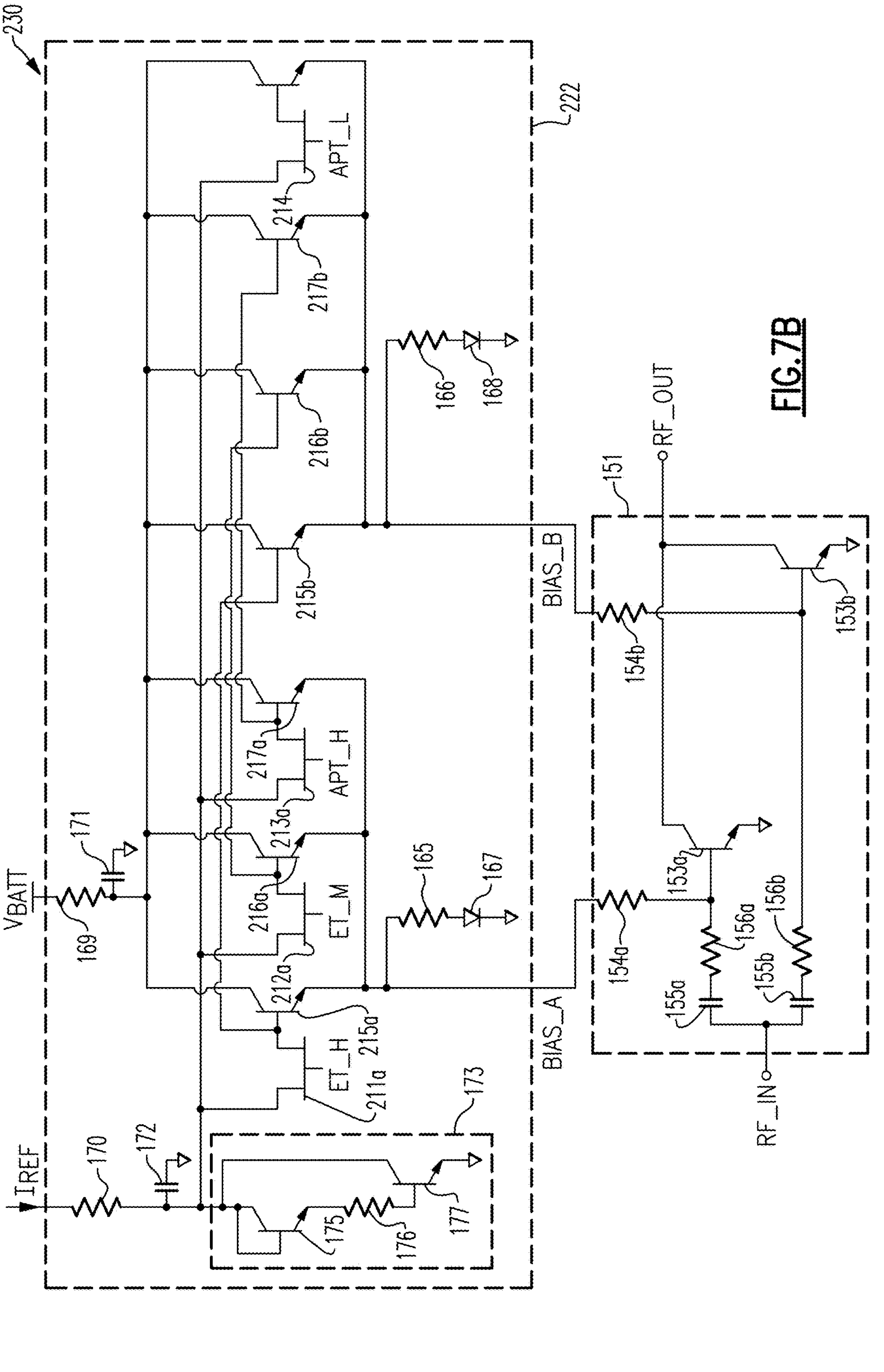
FIG. 7B is a schematic diagram of another embodiment of a power amplifier system.

FIG. 7B is a schematic diagram of another embodiment of a power amplifier system 230. The power amplifier system 230 includes a power amplifier 151 and a power amplifier biasing circuit 222.

The power amplifier system 230 of FIG. 7B is similar to the power amplifier system 220 of FIG. 7A, except that the power amplifier biasing circuit 222 omits the second high power ET mode FET 211*b*, the second mid power ET mode FET 212*b*, and the second high power APT mode FET 213*b*. Additionally, the first high power ET mode FET 211*a* controls the bases of both the first high power ET mode bipolar transistor 215*a* and the second high power ET mode bipolar transistor 215*b*. Furthermore, the first mid power ET mode FET 212*a* controls the bases of both the first mid power ET mode bipolar transistor 216*a* and the second mid power ET mode bipolar transistor 216*b*, while the first high power APT mode FET 213*a* controls the bases of both the first high power APT mode bipolar transistor 217*a* and the second high power APT mode bipolar transistor 217*b*.

By implementing the power amplifier biasing circuit 222 in this manner, a number of switches used for mode selection is reduced to thereby save layout area.

Figure 8A:
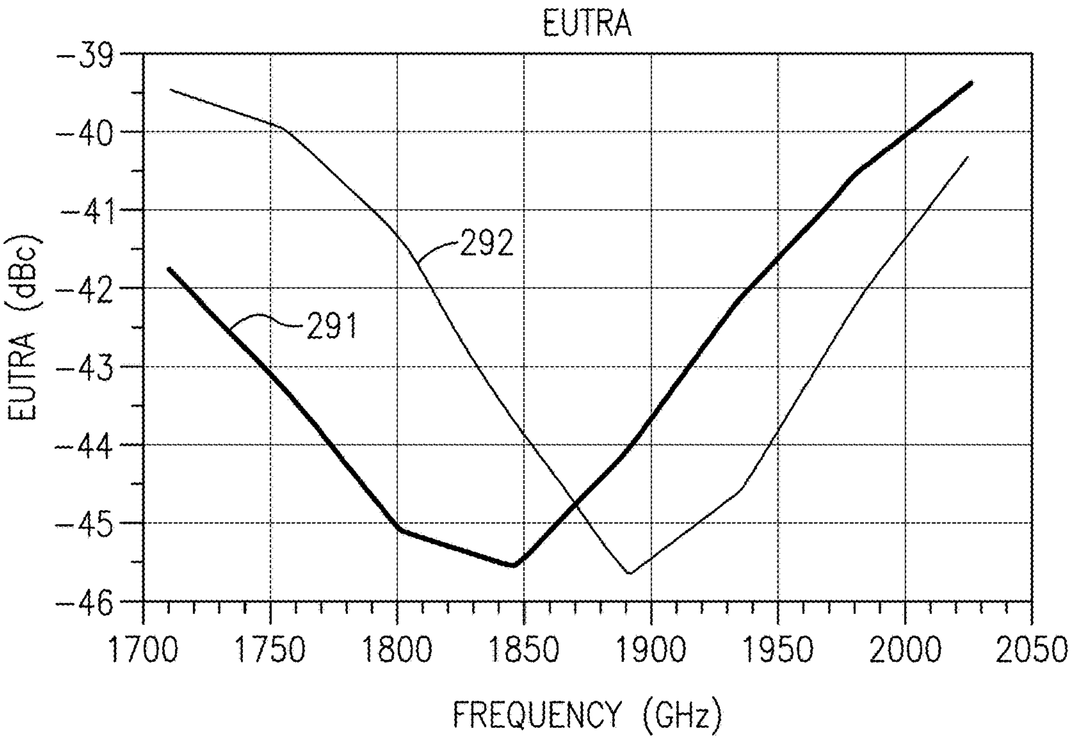
FIG. 8A is a graph of one example of Evolved Universal Terrestrial Radio Access (EUTRA) versus frequency for a power amplifier system.

FIG. 8A is a graph of one example of Evolved Universal Terrestrial Radio Access (EUTRA) in decibels relative to the carrier (dBc) versus frequency for a power amplifier system. The graph includes a first EUTRA plot 291 for a power amplifier system without switchable transistor array and biasing, and a second EUTRA plot 292 for one implementation of a power amplifier system with switchable transistor array and biasing. As shown in FIG. 8A, EUTRA performance is improved by switching both a number of active transistor elements of a power amplifier and a bias of the power amplifier based on power mode.

Figure 8B:
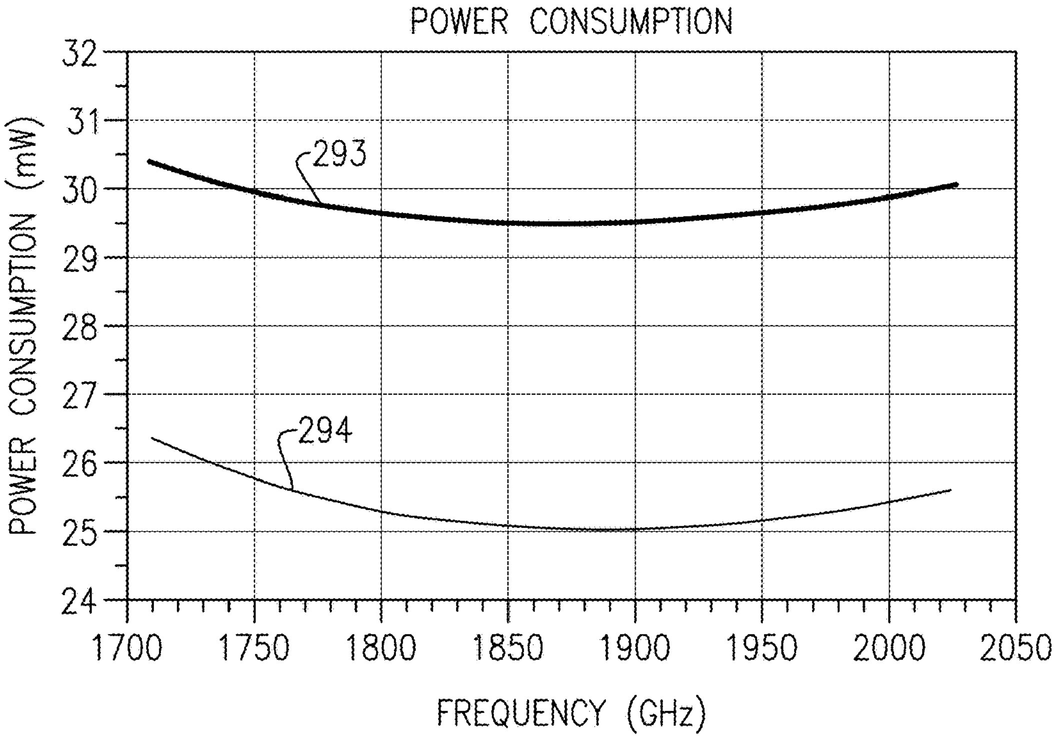
FIG. 8B is a graph of one example of power consumptions versus frequency for a power amplifier system.

FIG. 8B is a graph of one example of power consumptions versus frequency for a power amplifier system. The graph includes a first power consumption plot 293 for a power amplifier system without switchable transistor array and biasing, and a second power consumption plot 294 for one implementation of a power amplifier system with switchable transistor array and biasing. As shown in FIG. 8B, power consumption is improved by switching both a number of active transistor elements of a power amplifier and a bias of the power amplifier based on power mode.

Figure 9A:
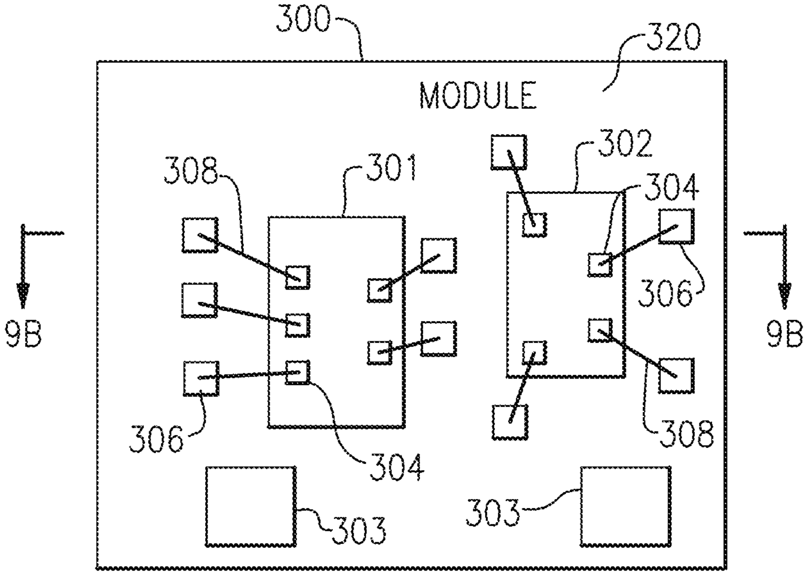
FIG. 9A is a schematic diagram of one embodiment of a packaged module.
Figure 9B:
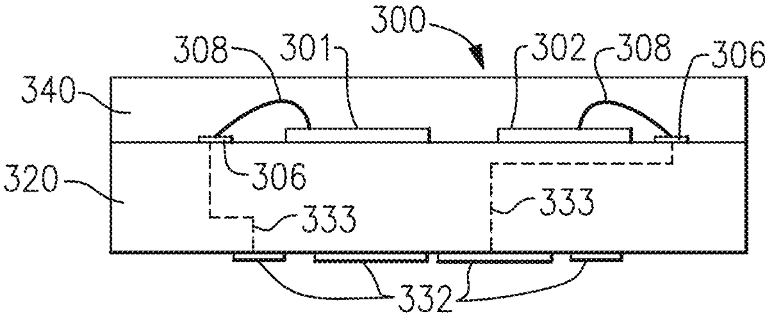
FIG. 9B is a schematic diagram of a cross-section of the packaged module of FIG. 9A taken along the lines 9B-9B.

FIG. 9A is a schematic diagram of one embodiment of a packaged module 300. FIG. 9B is a schematic diagram of a cross-section of the packaged module 300 of FIG. 9A taken along the lines 9B-9B.

The packaged module 300 includes a first semiconductor die 301, a second semiconductor die 302, surface mount components 303, wirebonds 308, a package substrate 320, and encapsulation structure 340. The package substrate 320 includes pads 306 formed from conductors disposed therein. Additionally, the dies 301, 302 include pads 304, and the wirebonds 308 have been used to connect the pads 304 of the dies 301, 302 to the pads 306 of the package substrate 320.

The first semiconductor die 301 and/or the second semiconductor die 302 are implemented in accordance with one or more features of the present disclosure. In one example, the first semiconductor die 301 includes a power amplifier having a switchable transistor array, and the second semiconductor die 302 includes a switchable power amplifier biasing circuit. In a second example, the first semiconductor die 301 includes both a power amplifier having a switchable transistor array and a switchable power amplifier biasing circuit for biasing the power amplifier. In certain implementations, the first semiconductor die 301 and/or the second semiconductor die 302 include a serial interface, such as a MIPI RFFE bus, used to receive data for controlling such switching.

In certain implementations, the dies 301, 302 are manufactured using different processing technologies. In one example, the first semiconductor die 301 is manufactured using a heterojunction bipolar transistor (HBT) process, and the second semiconductor die 302 is manufactured using a complementary metal oxide semiconductor (CMOS) process.

The packaging substrate 320 can be configured to receive a plurality of components such as the dies 301, 302 and the surface mount components 303, which can include, for example, surface mount capacitors and/or inductors.

As shown in FIG. 9B, the packaged module 300 is shown to include a plurality of contact pads 332 disposed on the side of the packaged module 300 opposite the side used to mount the dies 301, 302. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the dies 301, 302 and/or the surface mount components 303. As shown in FIG. 9B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words “comprise,” “comprising,” and the like are to be construed in an inclusive sense, as opposed to an exclusive or exhaustive sense; that is to say, in the sense of “including, but not limited to.” The word “coupled”, as generally used herein, refers to two or more elements that may be either directly connected, or connected by way of one or more intermediate elements. Likewise, the word “connected”, as generally used herein, refers to two or more elements that may be either directly connected, or connected by way of one or more intermediate elements. Additionally, the words “herein,” “above,” “below,” and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:

a transceiver configured to generate a radio frequency input signal; and a front-end system including a power amplifier system operable in selected power mode chosen from a plurality of power modes, the power amplifier system including a power amplifier having a transistor array configured to amplify the radio frequency input signal to generate a radio frequency output signal, and a power amplifier biasing circuit configured to control both a number of active transistors of the transistor array and a bias of the power amplifier based on the selected power mode, the two or more power modes including a first power mode, a second power mode, and a third power mode, and the transistor array including a first power amplifier transistor and a second power amplifier transistor.

2. The mobile device of claim 1 wherein the first power amplifier transistor and the second power amplifier transistor are electrically connected in parallel between an input that receives the radio frequency input signal and an output that provides the radio frequency output signal.

3. The mobile device of claim 2 wherein the power amplifier biasing circuit is configured to activate both the first power amplifier transistor and the second power amplifier transistor in the first power mode, and to activate the second power amplifier transistor and deactivate the first power amplifier transistor in the second power mode.

4. The mobile device of claim 3 wherein the power amplifier biasing circuit is configured to bias the first power amplifier transistor with a first bias signal, and to bias the second power amplifier transistor with a second bias signal.

5. The mobile device of claim 4 wherein a bias level of the second bias signal is higher in the first power mode relative to the second power mode.

6. The mobile device of claim 4 wherein the first power amplifier transistor is a first bipolar transistor having a base configured to receive the first bias signal, and the second power amplifier transistor is a second bipolar transistor having a base configured to receive the second bias signal.

7. A mobile device comprising:

a transceiver configured to generate a radio frequency input signal; and a front-end system including a power amplifier system operable in selected power mode chosen from a plurality of power modes, the power amplifier system including a power amplifier having a transistor array configured to amplify the radio frequency input signal to generate a radio frequency output signal, and a power amplifier biasing circuit configured to control both a number of active transistors of the transistor array and a bias of the power amplifier based on the selected power mode, the transistor array including a first power amplifier transistor and a second power amplifier transistor electrically connected in parallel between an input that receives the radio frequency input signal and an output that provides the radio frequency output signal, the power amplifier biasing circuit configured to activate both the first power amplifier transistor and the second power amplifier transistor in a first power mode of the two or more power modes, to activate the second power amplifier transistor and deactivate the first power amplifier transistor in a second power mode of the two or more power modes, and to bias the first power amplifier transistor with a first bias signal and the second power amplifier transistor with a second bias signal, the first power amplifier transistor being a first field effect transistor having a gate configured to receive the first bias signal, and the second power amplifier transistor being a second field effect transistor having a gate configured to receive the second bias signal.

8. The mobile device of claim 3 wherein the first power mode is a high power mode and the second power mode is a low power mode.

9. The mobile device of claim 1 wherein the power amplifier biasing circuit is configured to receive the mode control signal over a serial interface.

10. The mobile device of claim 1 wherein the power amplifier biasing circuit is configured to activate the second power amplifier transistor in the first power mode, the second power mode, and the third power mode, and to activate the first power amplifier transistor in the first power mode and the second power mode but not in the third power mode.

11. The mobile device of claim 10 wherein the power amplifier biasing circuit provides a bias current to the second power amplifier transistor that is different for each of the first power mode, the second power mode, and the third power mode.

12. The mobile device of claim 7 wherein a bias level of the second bias signal is higher in the first power mode relative to the second power mode.

13. A power amplifier system comprising:

a power amplifier including an input configured to receive a radio frequency input signal, an output configured to provide a radio frequency output signal, and a transistor array electrically connected between the input and the output and configured to provide amplification to the radio frequency input signal; and a power amplifier biasing circuit configured to receive a mode control signal indicating a selected power mode chosen from two or more power modes, the power amplifier biasing circuit configured to control both a number of active transistors of the transistor array and a bias of the power amplifier based on the selected power mode, the two or more power modes including a first power mode, a second power mode, and a third power mode, and the transistor array including a first power amplifier transistor and a second power amplifier transistor.

14. The power amplifier system of claim 13 wherein the first power amplifier transistor and the second power amplifier transistor are electrically connected in parallel between the input and the output.

15. The power amplifier system of claim 14 wherein the power amplifier biasing circuit is configured to activate both the first power amplifier transistor and the second power amplifier transistor in the first power mode, and to activate the second power amplifier transistor and deactivate the first power amplifier transistor in the second power mode.

16. The power amplifier system of claim 15 wherein the power amplifier biasing circuit is configured to bias the first power amplifier transistor with a first bias signal, and to bias the second power amplifier transistor with a second bias signal.

17. The mobile device of claim 7 wherein the power amplifier biasing circuit is configured to receive the mode control signal over a serial interface.

18. The power amplifier system of claim 13 wherein the power amplifier biasing circuit is configured to activate the second power amplifier transistor in the first power mode, the second power mode, and the third power mode, and to activate the first power amplifier transistor in the first power mode and the second power mode but not in the third power mode.

19. The power amplifier system of claim 18 wherein the power amplifier biasing circuit provides a bias current to the second power amplifier transistor that is different for each of the first power mode, the second power mode, and the third power mode.

20. The mobile device of claim 7 further comprising an antenna configured to transmit the radio frequency output signal.

* * * * *